United States Patent
Tzou

(10) Patent No.: US 6,512,075 B1
(45) Date of Patent: Jan. 28, 2003

(54) HIGH TG BROMINATED EPOXY RESIN FOR GLASS FIBER LAMINATE

(75) Inventor: Ming-Jen Tzou, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 0 days.

(21) Appl. No.: 10/014,574

(22) Filed: Dec. 14, 2001

(51) Int. Cl.$^7$ ................................................ C08G 59/20
(52) U.S. Cl. .......................... 528/98; 528/102; 528/103
(58) Field of Search ............................ 528/98, 102, 103

(56) References Cited

FOREIGN PATENT DOCUMENTS

JP          02283717       * 11/1990

* cited by examiner

Primary Examiner—Robert Dawson
Assistant Examiner—D. Aylward
(74) Attorney, Agent, or Firm—Bacon & Thomas, PLLC

(57) ABSTRACT

A new brominated epoxy resin has been developed, which consists of following components:
  A. multifunctional phenol-benzaldehyde epoxy resin (formula 1) 10~70 weight %;
  B. difunctional epoxy resin 0~55 weight %;
  C. bromine-containing difunctional epoxy resin 0~20 weight %;
  D. tetrabromobisphenol-A epoxy resin 15~40 weight %;

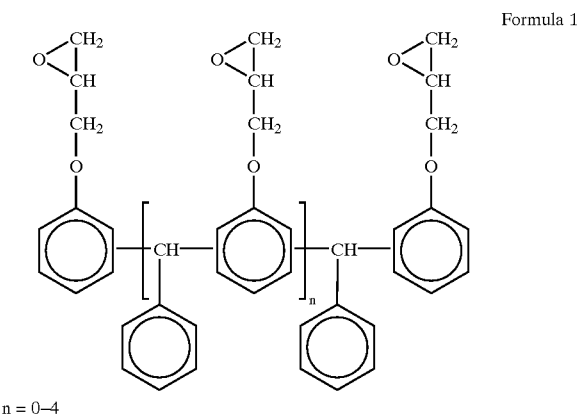

Formula 1 n = 0–4

The synthesis is that (D) tetra bromo bisphenol-A reacts with at least one of (A), (B) and (C), then adding the rest of (A),(B) and (C) and mixing them uniformly, the new brominated epoxy resin produced, which can be applied to glass fiber laminate, and showing proper reactivity and a broad working window. The laminate possesses high Tg and good heat resistance, and applying to electron material with high performance.

5 Claims, No Drawings

HIGH TG BROMINATED EPOXY RESIN FOR GLASS FIBER LAMINATE

FIELD OF INVENTION

The present invention relates to using a new brominated epoxy resin for processing glass fiber laminate with proper reactivity, broad working window and good operation, from which the obtained laminate substrate features high Tg and heat resistant property; it applies to electronic material with high performance.

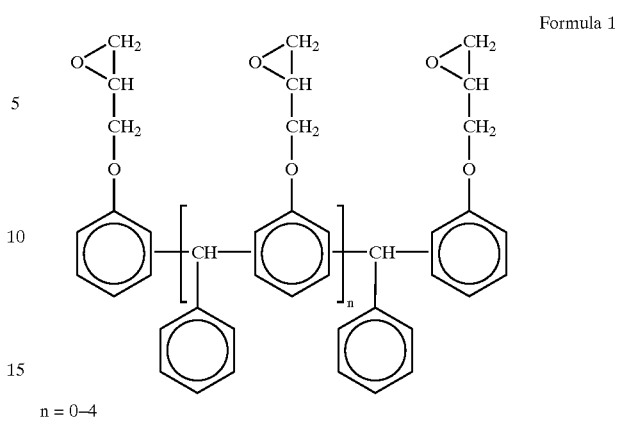

Formula 1 n = 0~4

BACKGROUND OF INVENTION

People are more and more demanding the electrical material with high performance along with printed circuit board has been developed in light, thin, miniaturization and sophistication way. The value of Tg is a very useful indicator to normal material, which represents the level of withstanding dynamic stress in certain temperature such as vibration, high temperature, etc. If the temperature of material is higher than Tg, it would results in poor interlayer bonding, and furthermore lowering adhering strength of copper foil, thus it is an important subject matter and trend to develop a glass fiber laminate with high Tg and heat resistance.

Now, FR-4 substrate which is available in market is made of double functional brominated epoxy resin, Tg value is at 130~140° C., and the method of raising Tg value is to mix multifunctional epoxy resins such as o-cresol formaldehyde novolac epoxy, tetra functional epoxy, phenol novolac epoxy, etc., although Tg value can be raised by the above-mentioned resins and with good heat resistance, but when hardening to be done with usual hardening agent of dicyandiamide, it causes gel time faster and working window narrower. It has to be required to strictly control process in order to avoid substandard product, therefore it often influences the yield of qualified product and output capacity.

ADVANTAGEOUS EFFECT OF INVENTION

To solve operation problem of processing glass fiber laminate caused by the above-mentioned multifunctional epoxy resin such as o-cresol formaldehyde novolac epoxy, tetra functional epoxy and phenol novolac epoxy, the goal of the present invention is to provide a new brominated epoxy resin with proper reactivity, broad working window and good operation performance, high Tg, heat resistance, electricity, fire resistance and low moisture absorbance.

The present invention relates to brominated epoxy resin, which consists of (A) multifunctional phenol-benzaldehyde epoxy resin (formula 1), (B) difunctional epoxy, (C) difunctional bromine-containing epoxy resin and (D) tetrabromobisphenol-A.

is obtained by synthesis. When the synthesis is processed, it is to take (D) tetrabromobisphenol-A to react with at least one of (A),(B)and (C) (including one kind), after that the rest of (A),(B)and(C) are added and mixed, then a new brominated epoxy resin produced.

DETAILED DESCRIPTION OF INVENTION

The remarkable characteristics of the brominated epoxy resin which is invented by the present invention is that the multifunctional phenol-benzaldehyde epoxy resin has been advanced. Owing to its chemical structure possesses high density benzene rings and proper epoxy functional group numbers, so good heat resistance and high Tg obtained, meantime the stereospecific restriction of proper epoxy functional group numbers and benzene rings structure make them react properly. There is a higher melt viscosity, so the broad working window can produce a glass fiber laminate with high performance.

It is extremely important to control resin flow during hot-pressing substrate, if more flow happens, white burr or flash would appear, otherwise woven pattern easily exposes. The resin flow formula of $F(t)=(C/12)\times(P/A)\int dt/n(t)$ advanced by both Barlett and Bloechle in 1978 on resin flow rheology during hot-pressing process, of which C is constant, P is pressure, A is area of substrate and $\int dt/n(t)$ is flow integration. From the formula, it can be understood that when pressure and area of the substrate are fixed, the change of resin flow depend on (1) resin viscosity and (2) prepreg gel time, that is the resin flow is influenced by resin viscosity and prepreg gel time. The proper range of minimum melt viscosity and prepreg gel time should be controlled in order to insure the quality of laminate; minimum melt viscosity of resin during hot pressing in flow rheology should maintain at 4000–10000 poise, which calls "working window". The substrate with broad working window fits the different processes of raising temperature in hot pressing. Therefore, there is a broad application of the product, and meanwhile with good uniformity of the laminated substrate The new brominated epoxy resin obtained by synthesis with multifunctional phenol-benzaldehyde epoxy resin consists of (A) multifunctional phenol-benzaldehyde epoxy resin 10~70 weight %, (B) difunctional epoxy resin 0~55 weight %, (C) difunctional bromine-containing epoxy resin 0~20 weight % and (D) tetrabromobisphenol-A epoxy resin 15~40 weight %. It is to take (D) to react with at least one of (A),(B) and (C) (include one kind) and produce brominated epoxy resin (EP-0), then adding the rest of (A),(B) and (C) and mixing them unformly, the new brominated epoxy resin obtained. The above-mentioned brominated epoxy resin (EP-0) is still reacting at 90~120° C., the catalyst is added when reactants fully dissolved, the temperature of adding catalyst is at 100~130 ° C., and preferably 115~130° C. quaternary phosphonium salt and imidazole can be used as catalysts and getting better hue with quaternary phosphonium salt; the adding amount of catalysts represents 0.06~0.1 weight % of tetra bromo bisphenol-A , reacting temperature is at 150~200° C., and preferably 160~180° C., and reacting time is 60~180 min.

Multifunctional phenol-benzaldehyde epoxy resin exist in the above-mentioned new brominated epoxy resin is phenol-benzaldehyde and phenolic aldehyde resin obtained through reacting of phenol and benzaldehyde under the conditions of acid catalyst, which further reacts with epichlorohydrin under conditions of NaOH, then the multifunctional phenol-benzaldehyde epoxy resin synthesized, the conditions of synthesizing reaction like epoxidation of epichlorohydrin as usual. Epoxy equivalent weight (EEW)=210~260 g/eq of the synthesized multifunctional phenol-benzaldehyde epoxy resin, average functional group number=2~6, molecular weight(MW)=400~2500.(B) difunctional epoxy resin consists of bisphenol-A epoxy resin (diglycidyl ether of 2,2-bis (4-hydroxyphenyl) methane),bisphenol-F epoxy resin (diglycidyl ether of 2,2-bis(4-hydroxyphenyl)methane) i.e. bisphenol-F epoxy), epoxy equivalent weight (EEW) of (B) is 170–500 g/eq. (C) bromine-containing difunctional epoxy resin is tetra bromo bisphenol-A epoxy resin (diglycidyl ether of 2,2-bis(3,5dibromo-4-hydroxyphenyl)propane), and epoxy equivalent weight (EEW) of (C) is 300–500 g/eq, and bromine-containing amount is 30–50%. (D) tetrabromobisphenol-A (abbreviated to TBBA), its MW is 544.

The new brominated epoxy resin with MW 1500~4000, dispersive index of MW (Mw/Mn value)1.5~4.0 and EEW 300~500 g/eq can synthesize laminate varnish compound with hardening agent such as dicyandiamide, bisphenol-A, tetrabromobisphenol-A and multifunctional novolac. When dicyandiamide is used as hardening agent, the using amount is 2~8 phr, preferably 2~4 phr, but as polyhydric phenolic used, the using amount is the ratio of OH/EEW i.e.0.5~1.5, preferably 0.9~1.1.

The novolac compound made of the new brominated epoxy resin is needed to add promoter, the applicable promoters are imidazole and benzyldimethyl amina. Most preferably to use 2-phenyl imidazole and 2-methyl imidazole in adding amount of 0.01~0.15 phr.

The present invention will be understood more readily with reference to the following examples; however these examples are intended to illustrate the invention and are not to be construed to limit the scope of the invention.In the present invention, "part" and "%" respectively mean "weight part" and "weight %". The new brominated epoxy resin of the present invention can be made into copper foil epoxy laminate in the process known by the person skilled in the art, i.e.usually using dicyandiamide as hardening agent, and imidazole or tertiary amine as promoters as well as solvents (N,N-dimethyl formamide (DMF), acetone and butanone) regulating viscosity, then retting glass fiber cloth, which dried through heating and becomes prepreg, on one or both sides of which copper foil are laid, and making one or more than one prepregs laminate into a substrate, which is finally hot-pressed into a copper foil substrate.

EXAMPLE 1

Making 9.5 parts of multifunctional phenol-benzaldehyde epoxy resin (EEW:240,available from Nan Ya plastics Corporation, Taiwan, NPPN 433) 53.7 parts of bisphenol-A epoxy with epoxy equivalent weight (EEW) of 186 g/eq (available from Nan Ya plastics Corporation, Taiwan, NPEL-128E brand), 27.2 parts of tetrabromobisphenol_A (TBBA), 4.8 parts of tetrabromo bisphenol-A epoxy resin with EEW 390 g/eq (Nan Ya plastics Corporation, Taiwan, NPEB-400) and 4.8 parts of tetra functional epoxy with EEW 220 g/eq (available from Nan Ya plastics Corporation, Taiwan,NPPN-431) react at 170° C. for 120 min, then obtaining brominated epoxy resin "EP-1", which is dissolved into 20% acetone to obtain 80% solution, therefore the obtained epoxy resin "EP-1" possesses EEW of 390 g/eq, Mw of 2300, bromine-containing content of 18.2%.

The present invention is applied to compounding for copper foil substrate i.e. 100 parts of brominated epoxy resin "EP-1", 2.5 parts of dicyandiamide and 0.07 parts of 2-phenyl imidazole are dissolved into DMF and regulated into resin liquid of 65%.

The glass fiber cloth (available from Nan Ya plastics corporation, Taiwan, grade 7628) is retted with the above-mentioned resin, then drying a few minutes at 170° C., by controlling the drying time to regulate minimum melt viscosity of dried prepreg to 4000–10000 poise. Finally, 8 pieces of prepreg laminate between two copper foils with 35 $\mu$m thickness, under the pressure of 25 kgf/cm$^2$, the procedure of temperature control:

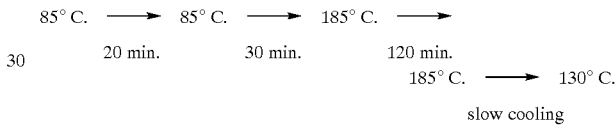

The copper foil substrate of thickness 1.6 mm can be obtained.

EXAMPLE 2

Making 40 shares of bisphenol-A epoxy with EEW 186 g/eq (available from Nan Ya plastics corporation, Taiwan, NPEL-128E), 13 parts of multifunctional phenol-benzaldehyde epoxy resin, 28 parts of tetrabromobisphenol-A (TBBA) and 2 parts of tetra functional epoxy resin (available from Nan Ya plastics corporation, Taiwan, NPPN-431) react at 170° C. for 120 min., after that cooled to 130° C. then adding 12 parts of bisphenol-A epoxy resin with EEW 168 g/eq (available from Nan Ya plastics corporation, Taiwan, NPEB-400), then mixed uniformly meanwhile the brominated epoxy resin "EP-2" obtained. The brominated epoxy resin is dissolved into 20% acetone to obtain 80% solution, then epoxy resin "EP-2" such obtained possesses EEW of 394 g/eq, Mw of 2138, and bromine-containing content of 18.8%.

The resin liquid is made of epoxy resin "EP-2", with which copper foil substrate is produced. The above-mentioned process is as same as example 1, varnish formula consists of 2.5 parts of dicyandiamide and 0.07 parts of 2-phenyl imidazole, which are dissolved in DMF and regulated into resin liquid of 65%., meanwhile by controlling the drying time to regulate minimum melt viscosity of dried prepreg to 4000–10000 poise.

EXAMPLE 3

Making 20.2 parts of bisphenol-A epoxy resin with EEW 186 g/eq (available from Nan Ya plastics corporation, Taiwan, NPEL-128), 49.5 parts of multifunctional phenol-benzaldehyde and 21.2 parts of TBBA react at 170° C. for 120 min., then cooling to 130° C., adding 7 parts of tetrabromobisphenol-A epoxy resin with EEW 390 g/eq (available from Nan Ya plastics corporation, Taiwan, NPEB-400) and 2 parts of tetra functional epoxy resin (available from Nan Ya plastics corporation, Taiwan, NPPN-431) mix uniformly, then the brominated epoxy resin "EP-3" obtained, it is further dissolved into 20% acetone to obtain 80% solution, said epoxy resin "EP-3" possesses EEW of 378 g/eq, Mw of 3366 and bromine-containing content of 15.8%. The resin liquid made of "EP-3" is used to process copper foil substrate, the process is as same as example 1, and the dissimilar is to use 2.5 parts of dicyandiamide and 0.05 parts of 2-phenyl imidazole which are dissolved in DMF and regulated into resin liquid of 65%., meanwhile by controlling the drying time to regulate minimum melt viscosity of dried prepreg to 4000–10000 poise.

COMPARATIVE EXAMPLE 1

Making 9.5 parts of ortho cresol multifunctional phenolic epoxy resin with EEW of 210 g/eq and functional group number of 12~13 (available from Nan Ya plastics corporation, Taiwan, NPCN-704), 53.2 parts of bisphenol-A epoxy resin with EEW of 186 g/eq (available from Nan Ya plastics corporation, Taiwan, NPEL-128E), 27.2 parts of TBBA, 4.8 parts of tetrabromo bisphenol-A epoxy resin with EEW of 390 g/eq (available from Nan Ya plastics corporation, Taiwan, NPEB-400) and 4.8 parts of tetra functional epoxy with EEW of 220 g/eq (available from Nan Ya plastics corporation, Taiwan, NPPN-431) react at 170° C. for 120 min., the brominated epoxy resin "EP-4" obtained is dissolved into 20% acetone to obtain 80% solution, then epoxy resin "EP-4" such obtained possesses EEW of 372 g/eq, Mw of 3500, and bromine-containing content of 18.2%.

Making 100 parts of the above obtained resin "EP-4", 2.5 parts of dicyandiamide and 0.03 parts of 2-methyl imidazole dissolve in DMF and regulated into resin liquid of 65%, meanwhile by controlling the drying time to regulate minimum melt viscosity of dried prepreg to 4000–10000 poise.

COMPARATIVE EXAMPLE 2

Making 37 parts of bisphenol-A epoxy with EEW of 186 g/eq (available from Nan Ya plastics corporation, NPEL-128E), 10 parts of ortho cresol phenolic epoxy resin with EEW of 210 g/eq (available from Nan Ya plastics corporation, Taiwan, NPCN-704), 26 parts of TBBA and 5 parts of tetra functional epoxy (available from Nan Ya plastics corporation, Taiwan, NPPN-431) react at 170° C. for 120 min. and then cooled to 130° C. and adding 15 parts of bisphenol-A epoxy with EEW of 186 g/eq (available from Nan Ya plastics corporation, Taiwan, NPEL-128E) and 7 parts of tetrabromobisphenol-A epoxy with EEW of 390 g/eq (available from Nan Ya plastics corporation, Taiwan, NPEB-400), and then mixed uniformly, the brominated epoxy resin "EP-5" obtained is further dissolved in 20% acetone and to obtain 80% solution, then epoxy resin "EP-5" such obtained possesses EEW of 354 g/eq, Mw of 2800, and bromine-containing content of 18.7%.

The resin liquid made of "EP-5" is used to produce copper foil substrate. The above-mentioned process is as same as example 1, the dissimilar is to use 2.5 parts of dicyandiamide and 0.02 parts of 2-phenyl imidazole dissolving in DMF and regulated into resin liquid of 65%, meanwhile by controlling the drying time to regulate minimum melt viscosity of dried prepreg to 4000–10000 poise.

COMPARATIVE EXAMPLE 3

Making 17 parts of bisphenol-A epoxy with EEW of 186 g/eq (available from Nan Ya plastics corporation, Taiwan, NPEL-128E), 38 parts of multifunctional phenolic epoxy with EEW of 178 g/eq available from Nan Ya plastics corporation, Taiwan, NPPN-638), 19 parts of TBBA and 5 parts of tetra functional epoxy (available from Nan Ya plastics corporation, Taiwan, NPPN-431) react at 170° C. for 120 min. then cooled to 130° C. and adding 9 parts of tetrabromobisphenol-A with EEW of 390 g/eq (available from Nan Ya plastics corporation, Taiwan, NPEB-400) and 15 parts of ortho cresol multifunctional phenolic epoxy with EEW of 210 g/eq mix uniformly, the brominated epoxy "EP-6" obtained is further dissolved in 25% acetone and to obtain 80% solution, then epoxy resin "EP-6" such obtained possesses EEW 370 g/eq, Mw 4000 and bromine-containing content of 15.6%.

The resin liquid made of "EP-6" is used to produce copper foil substrate. The above mentioned process is as same as example 1, the dissimilar is to use 2.5 parts of dicyandiamide and 0.02 shares of 2-phenyl imidazole dissolving in DMF and regulated into resin liquid of 65%, meanwhile by controlling the drying time to regulate minimum melt viscosity of dried prepreg to 4000–10000 poise.

COMPARATIVE EXAMPLE 4

Choosing standard difunctional brominated epoxy with EEW of 420 g/eq, Mw of 2600 and bromine-containing content of 19.3% (available from Nan Ya plastics corporation, Taiwan, NPEB-450), and making 95 parts of the above epoxy resin mix with 5 parts of tetra functional epoxy with EEW of 220 g/eq, then the brominated epoxy resin "EP-7" obtained is further dissolved in 20% acetone to obtain 80% solution.

The resin liquid made of "EP-7" is used to produce copper foil substrate, the above process is as same as example 1, the dissimilar is to use 2.5 parts of dicyandiamide and 0.05 parts of 2-phenyl imidazole dissolving in DMF and regulated into resin liquid of 65%, meanwhile by controlling the drying time to regulate minimum melt viscosity of dried prepreg to 4000–10000 poise.

Table 1 and table 2 respectively list examples, formulas and physical properties of prepreg and copper foil substrate.

TABLE 1

| | formulas of examples and comparative examples | | | | | | unit: grams |
|---|---|---|---|---|---|---|---|
| Item | Example 1 | Example 2 | Example 3 | Comparative Example 1 | Comparative Example 2 | Comparative Example 3 | Comparative Example 4 |
| EP-1(Solid) | 100 | | | | | | |
| EP-2(Solid) | | 100 | | | | | |
| EP-3(Solid) | | | 100 | | | | |
| EP-4(Solid) | | | | 100 | | | |
| EP-5(Solid) | | | | | 100 | | |

TABLE 1-continued formulas of examples and comparative examples unit: grams

| Item | Example 1 | Example 2 | Example 3 | Comparative Example 1 | Comparative Example 2 | Comparative Example 3 | Comparative Example 4 |
|---|---|---|---|---|---|---|---|
| EP-6(Solid) | | | | | | 100 | |
| EP-7(Solid) | | | | | | | 100 |
| acetone | 25 | 25 | 25 | 25 | 25 | 33.3 | 25 |
| dicydiamide | 2.5 | 2.5 | 2.5 | 2.5 | 2.5 | 2.5 | 2.5 |
| 2-methyl imidazole | — | — | — | — | — | — | 0.05 |
| 2-phenyl imidazole | 0.07 | 0.07 | 0.05 | 0.03 | 0.02 | 0.02 | — |
| N,N'-dimethyl fomamide | 30 | 30 | 30 | 30 | 30 | 30 | 30 |

TABLE 2

Physical properties of examples and comparative examples

| Item | Example 1 | Example 2 | Example 3 | Comparative Example 1 | Comparative Example 2 | Comparative Example 3 | Comparative Example 4 |
|---|---|---|---|---|---|---|---|
| varnish gel time (170° C.) | 292 sec. | 310 sec. | 315 sec. | 304 sec. | 285 sec. | 170 sec. | 286 sec. |
| prepreg gel time (170° C.) | 133 sec. | 130 sec. | 134 sec. | 100 sec. | 95 sec. | 80 sec. | 136 sec. |
| minimum melt viscosity of prepreg (poise) *1 | 4200 | 6000 | 5200 | 5000 | 5300 | 5200 | 4800 |
| glass transition temperature (° C., DSC) *2 | 150 | 150 | 170 | 151 | 152 | 174 | 140 |
| Moisture absorption rate *3 | 0.2% | 0.2% | 0.18% | 0.2% | 0.2% | 0.18% | 0.23% |
| Solder-heat resistance at 288° C. (after 30 min. autoclave treatment) *4 | 5 min. | 5 min. | 5 min. | 5 min. | 5 min. | 5 min. | 3 min. 40 sec. |
| Peeling strength of copper foil (lb/inch) | 11.5 | 11.5 | 9 | 11 | 11 | 8 | 12 |
| Fire-resisting test(UL-94) | V0 | V0 | V0 | V0 | V0 | V0 | V0 |

*1 Shimazu CFT-100 flowmeter is used to test minimum melt viscosity, rate of raising temperature = 1.75° C./min.
*2 Differential Scanning Calorinetry (DSC) analyzer used.
*3 Sample is heated in pressure pot at 120° C. and 2 atm for 30 min.
*4 Sample is retted in welding tin fumace of 288° C. after heating in the above said pressure pot, and recording the time needed for delamination.

Table 1 and table 2 show that: (1) When varnish gel time=300 sec.±15 sec., the reaction speed of the brominated epoxy depends on quantity of promoter; so examples indicate: the reaction speed of brominated epoxy resin ("EP-1", "EP-2", "EP-3") synthesized with multifunctional phenol-benzaldehyde epoxy is lower than one of the brominated epoxy resin ("EP-4", "EP-5", "EP-6") synthesized with ortho cresol multifunctional phenolic epoxy resin and multifunctional epoxy resin in the comparative examples. (2) When minimum melt viscosity of the epoxy resin is approximately controlled at 5000 poise, the gel time of prepreg of the brominated epoxy ("EP-1", "EP-2","EP-3") synthesized with multifunctional phenol-benzaldehyde epoxy ("EP-4", "BP-5", "EP-6")synthesized with ortho cresol multifunctional phenolic epoxy resin in comparative examples, which approach the difunctional epoxy resin (brominated epoxy "EP-7") synthesized with the multifunctional phenol-benzaldehyde epoxy, and possesses a broad working window. (3) The brominated epoxy resin synthesized with multifunctional phenol-benzaldehyde epoxy resin possesses high Tg and heat resistance.

Testing Method Used in This Invention

1. Varnish Gel Time

The way of testing the reactivity of varnish is that solvent of epoxy and dicyandiamide is dissolved with DMF (concentration of solvent=13.3%), 2-phenyl imidazole or 2-methyl imidazole solvent is dissolved with DMF (concentration of sovent=14.28%), which is prepared into varnish-mixing liquid, 0.3 ml of which is dropped onto the hot plate, temperature of the hot plate=170° C., then recording gel time.

2. Prepreg Gel Time

The way of testing prepreg is that 0.2 mg of prepreg powder are weighed, then laid onto a hot plate, temperature of the plate=170° C., recording gel time.

3. Minimum Melt Viscosity of Prepreg

Shimazu CFT-100 flowmeter is applied to determine the minimum melt viscosity of prepreg, 1.8 g prepreg powder is formed into a shape of column, range of temperature is 80–130° C., rate of raising temperature is 1.75° C./min.

4. Moisture Absorption Rate

The way of testing moisture absorption rate is that the etched substrate is cut into square sample of 5 $cm^2$, then putting it into autoclave for 30 min, then in an oven of 105° C. for 2 hr., condition of autoclave is 2 atm×120° C., after that recording the difference of weights before and after autoclave, which is divided by primary weight of sample, then rate obtained.

5. Solder-heat Resistance at 288° C.

The way of testing solder-heat resistance at 288° C. is that the sample from the above autoclave is retted in solder furnace of 288° C., then recording the time of delamination.

What is claimed is:

1. A high Tg brominated epoxy resin for a glass fiber laminate, which is characterized in forming with (A) multifunctional phenol-benzaldehyde epoxy resin (formula 1.) 10~70 weight %, (B) difunctional epoxy resin 0~55 weight %, (C) difunctional bromine-containing epoxy resin 0~20 weight % and (D) tetrabromobisphenol-A 15~40 weight %, then taking (D) to react with at least one of (A), (B) and (C), and then added with the rest of (A), (B) and (C), and mixing well to obtain brominated epoxy resin with average molecular weight (Mw) of 1500~4000, dispersive index in molecular weight of 1.5~4.0 (Mw/Mn), epoxy equivalent weight (EEW) of 300~450 g/eq, and glass Tg of 150~190° C.

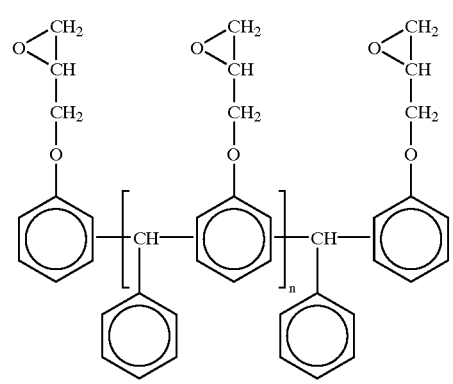

Formula 1 n = 0–4

2. A high Tg brominated epoxy resin for a glass fiber laminate as claimed in claim 1 wherein said (A) is the multifunctional phenol-benzaldehyde epoxy resin with epoxy equivalent weight (EEW) of 210~260 g/eq, average functional group number of 2–6 and molecular weight of 400~2500.

3. A high Tg brominated epoxy resin for a glass fiber laminate as claimed in claim 1 wherein said (B) is difunctional epoxy resin containing bisphenol-A epoxy resin and bisphenol-F epoxy resin, and epoxy equivalent weight (EEW) of 170~500 g/eq.

4. A high Tg brominated epoxy resin for a glass fiber laminate as claimed in claim 1 wherein said (C) is tetrabromobisphenol-A epoxy resin with epoxy equivalent weight (EEW) of 300~500 g/eq and bromine-containing content of 30~55%.

5. A high Tg brominated epoxy resin for a glass fiber laminate as claimed in claim 1 wherein said (D) is tetrabromo bisphenol-A with molecular weight of 544.

* * * * *